United States Patent
Sneh

(10) Patent No.: US 6,638,862 B2
(45) Date of Patent: *Oct. 28, 2003

(54) RADICAL-ASSISTED SEQUENTIAL CVD

(75) Inventor: Ofer Sneh, Branchburg, NJ (US)

(73) Assignee: Genus, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/213,781

(22) Filed: Aug. 6, 2002

(65) Prior Publication Data

US 2002/0197864 A1 Dec. 26, 2002

Related U.S. Application Data

(62) Division of application No. 09/747,649, filed on Dec. 22, 2000, now Pat. No. 6,451,695, which is a division of application No. 09/267,953, filed on Mar. 11, 1999, now Pat. No. 6,200,893.

(51) Int. Cl.[7] .............................................. H01L 21/44
(52) U.S. Cl. ....................................... 438/685; 438/680
(58) Field of Search ................................ 438/685, 681, 438/680; 427/301, 255.26

(56) References Cited

U.S. PATENT DOCUMENTS 5,916,365 A * 6/1999 Sherman ...................... 117/92
6,365,235 B2 * 4/2002 Koulik et al. ................ 427/525
6,475,910 B1 * 11/2002 Sneh ............................ 438/685

OTHER PUBLICATIONS

U.S. patent application Ser. No. 09/267,953, Sneh, filed Mar. 11, 1999.

* cited by examiner

Primary Examiner—Caridad Everhart
(74) Attorney, Agent, or Firm—Donald R. Boys; Central Coast Patent Agency, Inc.

(57) ABSTRACT

A new method for CVD deposition on a substrate is taught wherein radical species are used in alternate steps to depositions from a molecular precursor to treat the material deposited from the molecular precursor and to prepare the substrate surface with a reactive chemical in preparation for the next molecular precursor step. By repetitive cycles a composite integrated film is produced. In a preferred embodiment the depositions from the molecular precursor are metals, and the radicals in the alternate steps are used to remove ligands left from the metal precursor reactions, and to oxidize or nitridize the metal surface in subsequent layers. A variety of alternative chemistries are taught for different films, and hardware combinations to practice the invention are taught as well.

3 Claims, 3 Drawing Sheets

*Fig. 2 - Prior Art*

RADICAL-ASSISTED SEQUENTIAL CVD

CROSS-REFERENCE TO RELATED DOCUMENTS

The present application is a divisional application of prior patent application Ser. No. 09/747,649, filed on Dec. 22, 2000 now U.S. Pat. No. 6,451,695, which is a divisional application from prior application Ser. No. 09/267,953, filed on Mar. 11, 1999, now issued as U.S. Pat. No. 6,200,893. Priority is claimed to both cases and they are both incorporated herein in their entirety by reference.

FIELD OF THE INVENTION

The present invention is in the area of chemical vapor deposition, and pertains more particularly to new methods and apparatus for depositing films by atomic layer deposition.

BACKGROUND OF THE INVENTION

In the manufacture of integrated circuits, deposition of thin films of many pure and compound materials is necessary, and many techniques have been developed to accomplish such depositions. In recent years the dominant technique for deposition of thin films in the art has been chemical vapor deposition (CVD), which has proven to have superior ability to provide uniform even coatings, and to coat relatively conformally into vias and over other high-aspect and uneven features in wafer topology. As device density has continued to increase and geometry has continued to become more complicated, even the superior conformal coating of CVD techniques has been challenged, and new and better techniques are needed.

The approach of a variant of CVD, Atomic Layer Deposition has been considered for improvement in uniformity and conformality, especially for low temperature deposition. However the practical implementation of this technology requires a solution to higher purity and higher throughput. This patent addresses these requirements.

Atomic Layer Deposition

In the field of CVD a process known as Atomic Layer Deposition (ALD) has emerged as a promising candidate to extend the abilities of CVD techniques, and is under rapid development by semiconductor equipment manufacturers to further improve characteristics of chemical vapor deposition. ALD is a process originally termed Atomic Layer Epitaxy, for which a competent reference is: *Atomic Layer Epitaxy*, edited by T. Suntola and M. Simpson, published by Blackie, Glasgo and London in 1990. This publication is incorporated herein by reference.

Generally ALD is a process wherein conventional CVD processes are divided into single-monolayer deposition steps, wherein each separate deposition step theoretically goes to saturation at a single molecular or atomic monolayer thickness, and self-terminates.

The deposition is the outcome of chemical reactions between reactive molecular precursors and the substrate. In similarity to CVD, elements composing the film are delivered as molecular precursors. The net reaction must deposit the pure desired film and eliminate the "extra" atoms that compose the molecular precursors (ligands). In the case of CVD the molecular precursors are fed simultaneously into the CVD reactor. A substrate is kept at temperature that is optimized to promote chemical reaction between the molecular precursors concurrent with efficient desorption of byproducts. Accordingly, the reaction proceeds to deposit the desired pure film.

For ALD applications, the molecular precursors are introduced into the ALD reactor separately. This is practically done by flowing one precursor at a time, i.e. a metal precursor —$ML_x$(M=Al, W, Ta, Si etc.) that contains a metal element —M which is bonded to atomic or molecular ligands —L to make a volatile molecule. The metal precursor reaction is typically followed by inert gas purging to eliminate this precursor from the chamber prior to the separate introduction of the other precursor. An ALD reaction will take place only if the surface is prepared to react directly with the molecular precursor. Accordingly the surface is typically prepared to include hydrogen-containing ligands —AH that are reactive with the metal precursor. Surface—molecule reactions can proceed to react with all the ligands on the surface and deposit a monolayer of the metal with its passivating ligand: substrate —AH+$ML_x$→ substrate-$AML_y$+HL, where HL is the exchange reaction by-product. During the reaction the initial surface ligands —AH are consumed and the surface becomes covered with L ligands, that cannot further react with the metal precursor —$ML_x$. Therefore, the reaction self-saturates when all the initial ligands are replaced with —$ML_y$ species.

After completing the metal precursor reaction the excess precursor is typically removed from the reactor prior to the introduction of another precursor. The second type of precursor is used to restore the surface reactivity towards the metal precursor, i.e. eliminating the L ligands and redepositing AH ligands.

Most ALD processes have been applied to deposit compound films. In this case the second precursor is composed of a desired (usually nonmetallic) element —A (i.e. O, N, S), and hydrogen using, for example $H_2O$, $NH_3$, or $H_2S$. The reaction: —ML+$AH_z$→—M—AH+HL (for the sake of simplicity the chemical reactions are not balanced) converts the surface back to be AH-covered. The desired additional element —A is deposited and the ligands L are eliminated as volatile by-product. Again, the reaction consumes the reactive sites (this time the L terminated sites) and self-saturates when the reactive sites are entirely depleted.

The sequence of surface reactions that restores the surface to the initial point is called the ALD deposition cycle. Restoration to the initial surface is the keystone of ALD. It implies that films can be layered down in equal metered sequences that are all identical in chemical kinetics, deposition per cycle, composition and thickness. Self-saturating surface reactions make ALD insensitive to transport non-uniformity either from flow engineering or surface topography (i.e. deposition into high aspect ratio structures). Non uniform flux can only result in different completion time at different areas. However, if each of the reactions is allowed to complete on the entire area, the different completion kinetics bear no penalty.

As is often the case with process development, the initial promised advantages of a new technique do not, in the end, attain their full initial promise. Unfortunately, ALD has a serious fundamental problem. Unlike CVD reactions that are of a continuous steady state nature, ALD reactions follow kinetics of molecular-surface interaction. Kinetics of molecular-surface reactions depends on the individual reaction rate between a molecular precursor and a surface reactive site and the number of available reactive sites. As the reaction proceeds to completion, the surface is converted from being reactive to non-reactive. As a result the reaction rate is slowing down during the deposition. In the simplest case the rate, dN/dt is proportional to the number of reactive sites, $dN/dt=-kN$, where N is the number of reactive sites and k is the (single site) reaction rate. Eliminating reactive sites (or growing of the already-reacted sites) follows an exponential time dependence $kN(t)=kN_0\exp(-kt)$. This fundamental property of molecule-surface kinetics was named after the great scientist Langmuir, and is quite well-known in the art.

The interpretation of Langmuirian kinetics limitations illustrates a serious drawback of ALD and a severe deviation from the ideal picture. Accordingly, the self-terminating reactions never really self-terminate (they would require an infinite time because the rate is exponentially decreasing). It means that under practical conditions the surface is never entirely reacted to completion after a deposition cycle. If the surface is not completely reacted there are leftover undesired elements in the film. For example, if the $ML_x$ reaction cannot totally consume the surface —AH sites, the film will have H incorporation. Likewise, if the $AH_y$ reaction is not carried to completion, undesired L incorporation is inevitable. Clearly, the quality of the film depends on the impurity levels. The throughput-quality tradeoff is of particular concern because it carries an exponential throughput penalty to attain a reduction of impurity levels.

In conventional atomic layer deposition one must accept low throughput to attain high-purity film, or accept lower-purity films for higher throughput. What is clearly needed is an apparatus and methods which not only overcome the Langmuirian limitations but simultaneously provide higher-purity films than have been available in the prior art methods. Such apparatus and methods are provided in embodiments of the present invention, taught in enabling detail below.

SUMMARY OF THE INVENTION

In a preferred embodiment of the present invention a method for depositing a metal on a substrate surface in a deposition chamber is provided, comprising steps of (a) depositing a monolayer of metal on the substrate surface by flowing a molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing at least one radical species into the chamber and over the surface, the radical species highly reactive with the surface ligands of the metal precursor layer and eliminating the ligands as reaction product, and also saturating the surface, providing the first reactive species; and (e) repeating the steps in order until a metallic film of desired thickness results.

In many such embodiments the radical species is atomic hydrogen. Using atomic hydrogen a broad variety of pure metals may be deposited, such as tungsten, tantalum, aluminum, titanium, molybdenum, zinc, hafnium, niobium and copper.

In another aspect of the invention a method is provided for depositing a metal oxide on a substrate surface in a deposition chamber, comprising steps of (a) depositing a monolayer of metal on the substrate surface by flowing a metal molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the radical species highly reactive with the reaction product and combining with the reaction product to create volatile species and saturate the surface with the first radical species; (e) flowing radical oxygen into the chamber to combine with the metal monolayer deposited in step (a), forming an oxide of the metal; (f) flowing a third radical species into the chamber terminating the surface with the first reactive species in preparation for a next metal deposition step; and (g) repeating the steps in order until a composite film of desired thickness results.

In this method the first and third radical species may be both atomic hydrogen, and the metal surface in step (f) is terminated with hydroxyl species reactive with the metal precursor to deposit the metal. In another embodiment the oxygen and hydrogen atomic steps (e) and (f) are repeated to improve film quality. In still another embodiment steps (e) and (f) are combined into one step wherein the surface is reacted with hydrogen and oxygen atoms simultaneously.

In various embodiments for depositing oxides the oxides can be tantalum pentoxide, aluminum oxide, titanium oxide, niobium pentoxide, zirconium oxide, hafnium oxide, zinc oxide, molybdenum oxide, manganese oxide, tin oxide, indium oxide, tungsten oxide and silicon oxide, among others.

In some embodiments the first radical species is atomic hydrogen and steps (e) and (f) are united to one step using OH radicals, and the metal surface in step (f) is terminated with hydroxyl species reactive with the metal precursor to deposit the metal.

In still another aspect of the invention a method for depositing a metal nitride on a substrate surface in a deposition chamber is provided, comprising steps of (a) depositing a monolayer of metal on the substrate surface by flowing a metal precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness results.

In this method the first and third atomic radical species may both be atomic hydrogen, and the metal surface in step (f) may be terminated with amine species reactive with the metal precursor to deposit the metal. Further, steps (e) and (f) may be combined into one step wherein the surface is reacted with hydrogen and nitrogen atoms simultaneously.

In variations of this embodiment a variety of different nitrides may be produces, including, but limited to tungsten nitride, tantalum nitride, aluminum nitride, titanium nitride, silicon nitride and gallium nitride.

In another variation the first radical species may be atomic hydrogen and steps (e) and (f) may be united into one step using one or both of NH and NH$_2$ radicals, and the metal surface in step (f) is terminated with amine species reactive with the metal precursor to deposit the metal.

In yet another aspect of the invention a process for building a metal, metal oxide, or metal nitride film on a substrate surface is provided, wherein deposition steps comprise flowing a metal precursor gas or vapor over the surface with the surface terminated with a first chemical species reactive with the metal precursor to deposit the metal, are alternated with steps comprising flowing radical species over the freshly deposited metal layers to remove the ligands from the deposition steps and to provide the first chemical species to terminate the substrate surface preparatory to the next deposition reaction.

In this process a metal nitride film is built up by a step sequence of metal deposition by reacting a metal precursor gas with a surface terminated by amine species, then alternating exposure of the surface with atomic radical hydrogen, nitrogen and hydrogen again, thereby volatilizing products remaining from the metal deposition chemistry, nitridizing the deposited metal monolayer, then terminating the metal surface with amine species again in preparation for a next metal deposition step. A metal oxide film is built up by a step sequence of metal deposition by reacting a metal precursor gas with a surface terminated by hydroxyl species, then alternating exposure of the surface with atomic radical hydrogen, oxygen and hydrogen again, thereby volatilizing products remaining from the metal deposition chemistry, oxidizing the metal monolayer, then terminating the metal surface with hydroxyl species again in preparation for a next metal deposition step.

In yet another aspect of the invention a method for depositing a compound film on a substrate surface in a deposition chamber is provided, comprising steps of (a) depositing a monolayer of metal on the substrate surface by flowing a metal molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the radical species highly reactive with the reaction product and combining with the reaction product to create volatile species and saturate the surface with the first radical species; (e) flowing nonmetal atomic species into the chamber to combine with the metal monolayer deposited in step (a), forming a compound film of the metal; (f) flowing a third radical species into the chamber terminating the surface with the first reactive species in preparation for a next metal deposition step; and (g) repeating the steps in order until a composite film of desired thickness results.

In this method the first and third radical species may be both atomic hydrogen, and the metal surface in step (f) is terminated with hydride species of the nonmetallic element that are reactive with the metal precursor to deposit the metal. In a variation the non-metallic and hydrogen atomic steps (e) and (f) are repeated to improve the film quality. In another variation steps (e) and (f) are combined into one step wherein the surface is reacted with hydrogen and nonmetallic atoms simultaneously. A variety of films may be produced by practicing this variation of the invention as well, including but not limited to molybdenum disulfide and zinc sulfide.

In yet another aspect of the invention a radical-assisted sequential CVD (RAS-CVD) reactor is provided, comprising a chamber with controlled gas inlets for introducing gases in sequential steps and a heated substrate support for holding a substrate and exposing a surface of the substrate to incoming gases; and a plasma generation apparatus for generating radical atomic species for use in the reactor. In this reactor an aggregate metal layer is formed by depositing a monolayer of metal on the substrate surface by flowing a precursor gas or vapor bearing the metal over a surface of the substrate, the surface terminated by a first reactive species with which the precursor will react by depositing the metal and forming reaction product, leaving a metal surface not further reactive with the precursor, terminating flow of the precursor gas or vapor, flowing at least one atomic radical species into the chamber and over the surface, the atomic species highly reactive with the reaction product and combining with the reaction product, and also terminating the surface, providing the first reactive species, and repeating the steps in order until a composite film of desired thickness results.

In various embodiments the atomic radical species is atomic hydrogen. The precursor gas bearing the metal may be tungsten hexafluoride and the metal deposited tungsten.

In some embodiments the plasma generation apparatus comprises an electrode within the reactor chamber and a high frequency power supply connected to the electrode. In other embodiments the plasma generation apparatus comprises a showerhead-type gas distribution apparatus, and a plasma is generated within the showerhead apparatus to produce the radical species. In still other embodiments the atomic radical species is produced in a remote plasma generator, and the species are delivered to the reactor.

In the various embodiments of the invention a new process is provided wherein films of many sorts, including pure metals, oxides of metals, nitrides of metals, and other films, may be produced quickly and efficiently, with very high purity and with superior conformity to substrate topography and coverage within vias and other difficult surface geometries.

DESCRIPTION OF THE PREFERRED EMBODIMENTS

The inventor has developed an enhanced variation of ALD which alters the conventional surface preparation steps of ALD and overcomes the problems of conventional ALD, producing high throughput without compromising quality. The inventor terms the new and unique process Radical-Assisted Sequential CVD (RAS-CVD).

Figure 1:
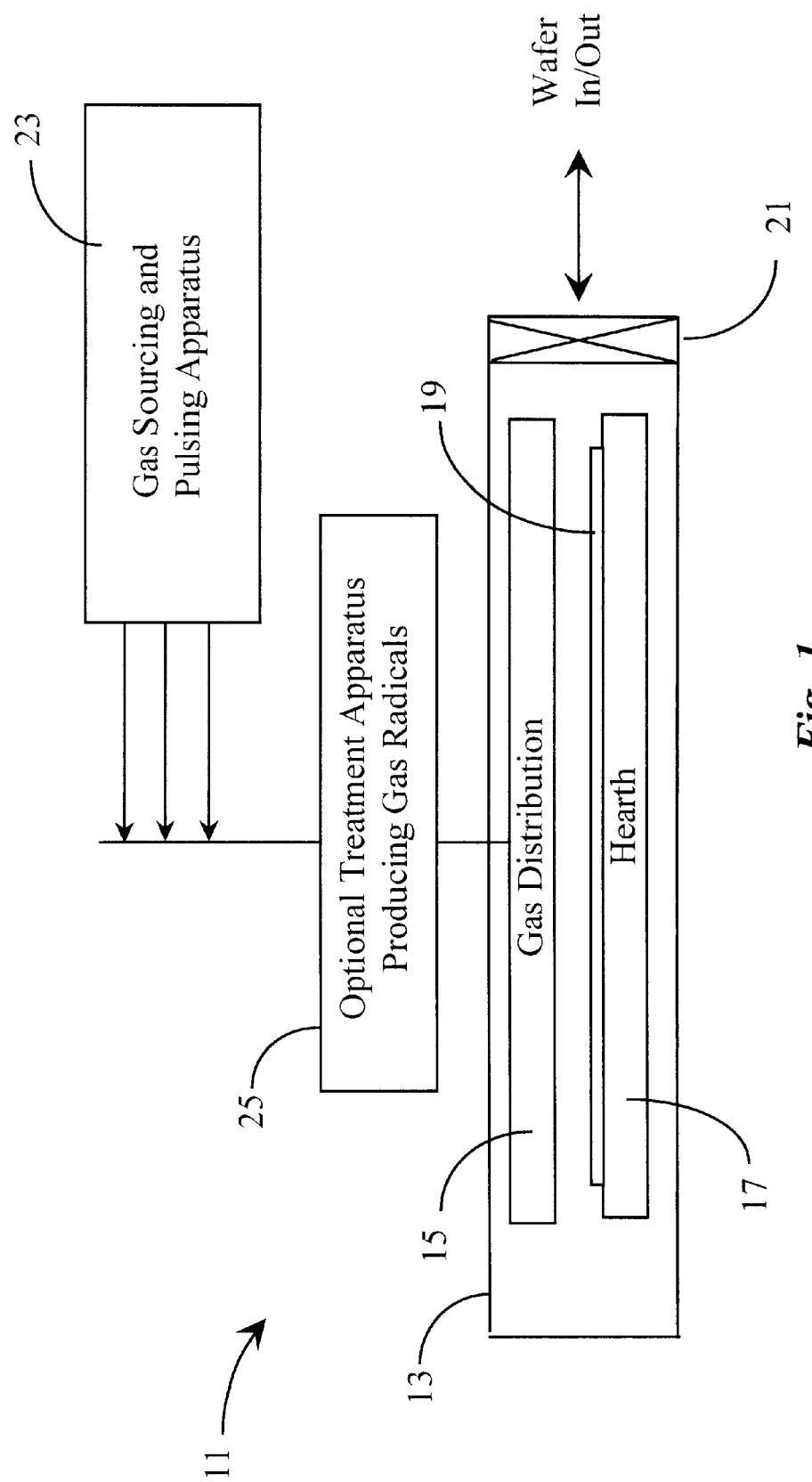
FIG. 1 is a generalized diagram of a reactor and associated apparatus for practicing a radical-assisted sequential CVD process according to an embodiment of the present invention.

FIG. 1 is a generalized diagram of a system 11 for practicing RAS-CVD according to an embodiment of the present invention. In this exemplary system a deposition chamber 13 has a heatable hearth for supporting and heating a substrate 19 to be coated, and a gas distribution apparatus, such as a showerhead 15, for delivering gaseous species to the substrate surface to be coated. Substrates are introduced and removed from chamber 13 via a valve 21 and substrate-handling apparatus not shown. Gases are supplied from a gas sourcing and pulsing apparatus 23, which includes metering and valving apparatus for sequentially providing gaseous materials. An optional treatment apparatus 25 is provided for producing gas radicals from gases supplied from apparatus 23.

The term radicals is well-known and understood in the art, but will be qualified again here to avoid confusion. By a radical is meant an unstable species. For example, oxygen is stable in diatomic form, and exists principally in nature in this form. Diatomic oxygen may, however, be caused to split to monatomic form, or to combine with another atom to produce ozone, a molecule with three atoms. Both monatomic oxygen and ozone are radical forms of oxygen, and are more reactive than diatomic oxygen. In many cases in embodiments of the present invention the radicals produced and used are single atom forms of various gases, such as oxygen, hydrogen, and nitrogen, although the invention is not strictly limited to monatomic gases.

Figure 2:
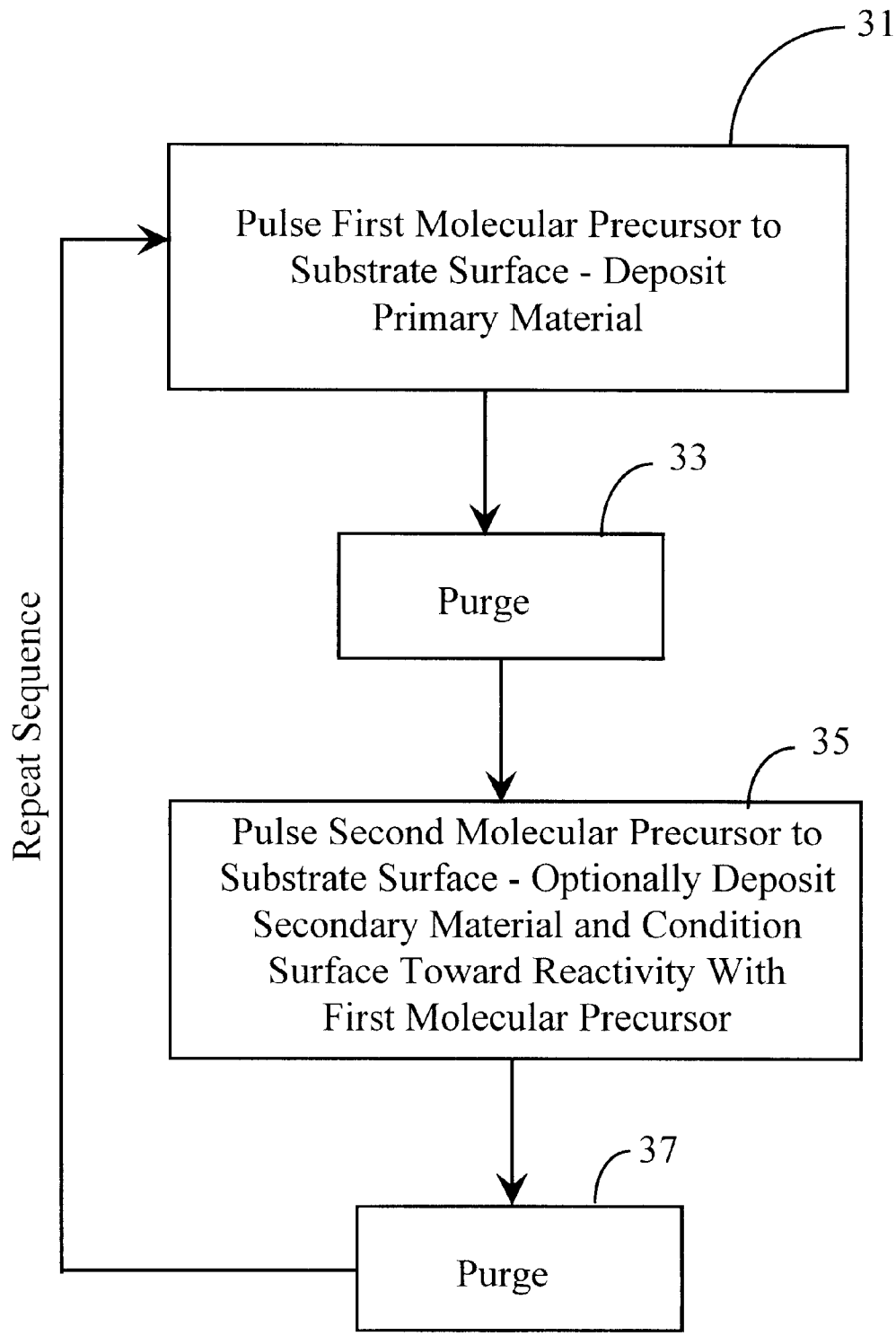
FIG. 2 is a step diagram illustrating the essential steps of an atomic layer deposition process.

FIG. 2 is a step diagram of a conventional Atomic Layer Deposition process, and is presented here as contrast and context for the present invention. In conventional ALD, as shown in FIG. 2, in step 31 a first molecular precursor is pulsed in to a reactor chamber, and reacts with the surface to produce (theoretically) a monolayer of a desired material. Often in these processes the precursor is a metal-bearing gas, and the material deposited is the metal; Tantalum from $TaCl_5$, for example.

In step 33 in the conventional process an inert gas is pulsed into the reactor chamber to sweep excess first precursor from the chamber.

In step 35 in the conventional system a second precursor, typically non-metallic, is pulsed into the reactor. The primary purpose of this second precursor is to condition the substrate surface back toward reactivity with the first precursor. In many cases the second precursor also provides material from the molecular gas to combine with metal at the surface, forming compounds such as an oxide or a nitride with the freshly-deposited metal.

At step 37 the reactor chamber is purged again to remove excess of the second precursor, and then step 31 is repeated. The cycle is repeated as many times as is necessary to establish a desired film.

Figure 3:
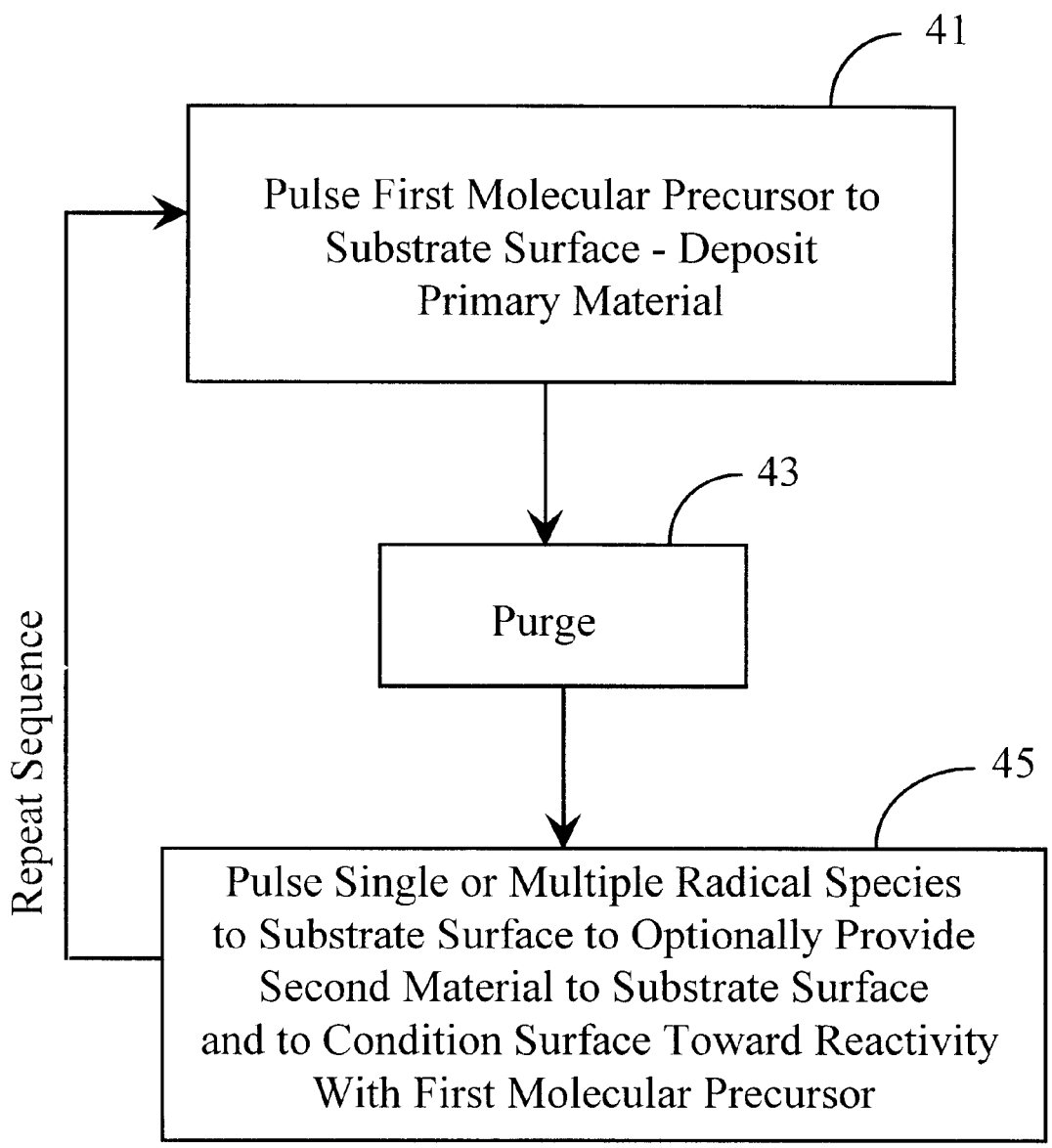
FIG. 3 is a step diagram illustrating steps in a radical-assisted CVD process according to an embodiment of the present invention.

FIG. 3 is a step diagram illustrating steps in a radical-assisted CVD process according to an embodiment of the present invention. In the unique process illustrated by FIG. 3 the first steps, steps 41 and 43, are the same as in the conventional process. A first precursor is pulsed in step 41 to react with the substrate surface forming a monolayer of deposit, and the chamber is purges in step 43. The next step is unique. In step 45 single or multiple radical species are pulsed to the substrate surface to optionally provide second material to the surface and to condition the surface toward reactivity with the first molecular precursor in a subsequent step. Then step 41 is repeated. There is no need for a second purge, and the cycle is repeated as often as necessary to accomplish the desired film.

Step 45 may be a single step involving a single radical species. For example, the first precursor may deposit a metal, such as in W from $WF_6$, and the radical species in step 45 may be atomic hydrogen. The atomic hydrogen very quickly and effectively neutralizes any remaining F to HF, and terminates the surface with atomic hydrogen, providing reactive surface for the next pulse of $WF_6$.

In many cases step 45 will be a compound step comprising substeps involving different radical species. A good example is a sequence of atomic hydrogen followed by atomic oxygen, followed by atomic hydrogen again. The first hydrogen step neutralizes Cl or other remaining ligand, the atomic oxygen provides an oxide of the freshly-deposited metal, and the second atomic hydrogen terminated the surface with (OH) in preparation for the next metal precursor step.

There are a broad variety of materials and combinations in step 45, and many are disclosed in more detail below, along with a more complete explanation of process chemistry.

In RAS-CVD, following the metal precursor reaction, highly reactive radical species are introduced to quickly react with products of the metal precursor reaction and to prepare the surface for the next metal precursor reaction. Radical species, as introduced above, are reactive atoms or molecular fragments that are chemically unstable and therefore are extremely reactive. In addition, radicals chemisorb to surfaces with virtually 100% efficiency. Radicals may be created in a number of ways, and plasma generation has been found to be an efficient and compatible means of preparation.

RAS-CVD processes use only a single molecular precursor, in many cases a metal precursor. Surface preparation as well as the deposition of nonmetallic elements are accomplished by atom-surface reactions. Following the metal precursor reaction, The —ML terminated surface is reacted with hydrogen atoms to convert the surface into —MH and eliminate HL by-product. Unlike molecule-surface reactions, atom-surface reactions do not depend on the number density of reactive sites. Most atoms (except for noble gases) stick very efficiently to surfaces in an irreversible process because atomic desorption is usually unfavorable. The atoms are highly mobile on non-reactive sites and very reactive at reactive sites. Consequently, atom-surface reactions have linear exposure dependence, as well as high rates.

The —MH surface can be reacted with A atoms to yield a —M—A-surface. In this case some of the H ligands can be eliminated as $AH_y$. For example the —MH surface can be reacted with oxygen atoms to deposit oxide compound. Alternatively, —MH surface can be reacted again with $ML_x$ for atomic layer controlled deposition of M metal films. For the deposition of nitride compound films, A is atomic nitrogen. The surface after the A atomic reaction is terminated with A— and AH. At this point an additional atomic reaction with hydrogen converts the surface to the desired AH ligands that are reactive towards the metal precursor. Alternatively, the MH surface can be reacted with a mixture of A and H atoms to convert the surface into —AH terminated surface with one less step. All the above described reactions are radical-surface reactions that are fast and efficient and depend linearly on exposure. In addition, the final hydrogen reaction results in a complete restoration to the initial surface without any incorporation of impurities.

Another throughput benefit of RAS-CVD is that a single purge step after the metal precursor step is needed, rather than the two purge steps needed in the conventional process. Purge steps are expected by most researchers to be the most significant throughput-limiting step in ALD processes. Another advantage is that RAS-CVD promises longer system uptime and reduced maintenance. This is because atomic species can be efficiently quenched on aluminum walls of the deposition module. Downstream deposition on the chamber and pumping lines is therefore virtually eliminated. RAS-CVD eliminates the use of $H_2O$ and $NH_3$ that are commonly applied for oxides and nitrides deposition (respectively) in the prior art. These precursors are notorious to increase maintenance and downtime of vacuum systems.

According to the above a typical RAS-CVD cycle for a metal oxide film will comprise steps as follows:
1. Metal precursor reaction with —OH (hydroxyl) terminated surface to attach —O—$ML_y$ and eliminate the hydrogen by HL desorption. The surface becomes covered with L ligands, i.e. in the case of $TaCl_5$ the surface becomes covered with Cl atoms.
2. Purge with inert gas to sweep away excess metal precursor.
3. Atomic hydrogen step—eliminates the ligands L by HL desorption and terminates the surface with hydrogen.
4. Atomic oxygen step—reacts with monolayer of metal to form oxide. Atomic hydrogen again to leave hydroxyl saturated surface for next metal precursor step.

At this point the quality of oxide films (i.e. insulation properties, dielectric strength, charge trapping) can be improved by running steps 4+5 for multiple times. For example: $Al_2O_3$ RAS-CVD can be realized from trimethylaluminum $Al(CH_3)_3$, hydrogen and oxygen exposures. $Al(CH_3)_3$ reacting with —OH terminated surface will deposit —$OAl(CH_3)_x$ concurrent with the desorption of methane ($CH_4$). The —$OAl(CH_3)_x$ (x=1,2) surface will be treated with H atoms to eliminate x number of methane molecules and terminate the surface with —OAlH. This surface after consecutive (or concurrent) reaction with O atoms and H atoms will be terminated —OAl—OH which is the restoration state. At this point, the RAS-CVD process can proceed by applying another $Al(CH_3)_3$ reaction. Alternatively, the —OAl—OH surface can be exposed to another cycles of O and H atoms. At temperature above 100° C. this process will exchange OH groups and Al—O—Al bridge sites and the resulted —OAl—OH surface will be more thermodynamically favorable than the beginning surface, because the process eliminates the more strained (Al—O—)$_n$ ring structures as well as titrating away defects and broken bonds). Since the atomic reactions are rather fast, these quality improvements are not expected to be a major throughput concern. In fact, ultimate quality may be achieved by applying the O, H cycles for several times. Following, a given number of O, H atomic reactions the sequence will continue with the next $Al(CH_3)_3$ reaction.
6. Repeat steps from 1.

For metal nitrides atomic nitrogen is substituted for oxygen. For pure metal depositions the oxygen/nitrogen step may be eliminated in favor of a single atomic hydrogen step, such as for tungsten films. The hydrogen saturated surface after the first atomic hydrogen step is reactive with $WF_6$ to produce the pure metal.

The generic nature of RAS-CVD is advantageous for multiple layer combination films of different oxides, different nitrides, oxides with nitrides, different metals and metals with compound films.

In another unique process, useful for barrier layers, the WN process may be combined with the pure W process to produce alternating W and WN layers in a variety of schemes to suppress polycrystallization and to reduce the resistivity of the barrier layer. Other properties, such as electromigration may be controlled by an ability to provide a graded layer of WN with reduced nitrogen content at the copper interface for such applications.

In embodiments of the invention a broad variety of process chemistries may be practiced, providing a broad variety of final films. In the area of pure metals, for example, the following provides a partial, but not limiting list:
1. Tungsten from tungsten hexafluoride.
2. Tantalum from tantalum pentachloride.
3. Aluminum from either aluminum trichloride or trimethylaluminum.
4. Titanium from titanium tetrachloride or titanium tetraiodide.
5. Molybdenum from molybdenum hexafluoride.
6. Zinc from zinc dichloride.
7. Hafnium from hafnium tetrachloride.
8. Niobium from niobium pentachloride.
9. Copper from $Cu_3Cl_3$ In the area of oxides the following is a partial but not limiting list:
1. Tantalum pentoxide from tantalum pentachloride.
2. Aluminum oxide from trimethylaluminum or aluminum trichloride.
3. Titanium oxide from titanium tetrachloride or titanium tetraiodide.
4. Niobium pentoxide from niobium pentachloride.
5. Zirconium oxide from zirconium tetrachloride.
6. Hafnium oxide from hafnium tetrachloride.
7. Zinc oxide from zinc dichloride.
8. Molybdenum oxide from molybdenum hexafluoride or molybdenum pentachloride.
9. Manganese oxide from manganese dichloride.
10. Tin oxide from tin tetrachloride.
11. Indium oxide from indium trichloride or trimethylindium.
12. Tungsten oxide from tungsten hexafluoride.
13. Silicon dioxide from silicon tetrachloride.

In the area of nitrides, the following is a partial but not limiting list:
1. Tungsten nitride from tungsten hexafluoride.
2. Tantalum nitride from tantalum pentachloride.
3. Aluminum nitride from aluminum trichloride or trimethylaluminum.
4. Titanium nitride from titanium tetrachloride.
5. Silicon nitride from silicon tetrachloride or dichlorosilane.
6. Gallium nitride from trimethylgallium.

Hardware Requirements

Another advantage of RAS-CVD is that it is compatible in most cases with ALD process hardware. The significant difference is in production of atomic species and/or other radicals, and in the timing and sequence of gases to the process chamber. Production of the atomic species can be done in several ways, such as (1) in-situ plasma generation, (2) intra-showerhead plasma generation, and (3) external generation by a high-density remote plasma source or by other means such as UV dissociation or dissociation of metastable molecules referring again to FIG. 1, these methods and apparatus are collectively represented by apparatus 25.

Of the options, in-situ generation is the simplest design, but poses several problems, such as turn on—turn off times that could be a throughput limitation. Intra-showerhead generation has been shown to have an advantage of separating the atomic specie generation from the ALD space. The preferable method at the time of this specification is remote generation by a high-density source, as this is the most versatile method. The radicals are generated in a remote source and delivered to the ALD volume, distributed by a showerhead over the wafer in process.

It will be apparent to the skilled artisan that there are a variety of options that may be exercised within the scope of this invention as variations of the embodiments described above . . . some have already been described. For example, radicals of the needed species, such as hydrogen, oxygen, nitrogen, may be generated in several ways and delivered in the process steps. Further, ALD chambers, gas distribution, valving, timing and the like may vary in many particulars. Still further, many metals, oxides nitrides and the like may be produced, and process steps may be altered and interleaved to create graded and alternating films.

In addition to these variations it will be apparent to the skilled artisan that one may, by incorporating processes described herein, alternate process steps in a manner that alloys of two, three or more metals may be deposited, compounds may be deposited with two, three or more constituents, and such things as graded films and nanolaminates may be produced as well. These variations are simply variants using particular embodiments of the invention in alternating cycles, typically in-situ. There are many other variations within the spirit and scope of the invention, so the invention is limited only by the claims that follow.

What is claimed is:

1. A method of depositing metal on a substrate in a deposition chamber, comprising the steps of:

(a) preparing a surface of the substrate for chemical reactivity with a first precursor;
    (b) depositing a first layer of metal by flowing a first precursor bearing the metal over the surface of the substrate;
    (c) depositing one or more subsequent layers of metal on top of said first layer to build a metal film by repeatedly (i) flowing one or more radicalized species over the surface of the metal layer upon which said one or more subsequent layers of metal is to be deposited to render the surface of the metal layer chemically reactive to one or more precursors; and (ii) then flowing over the surface of the metal layer a precursor which is chemically reactive to the surface of the metal layer.

2. The method of claim 1, wherein the preparing step is performed by flowing one or more radicalized species over the surface of the substrate.

3. The method of claim 2, wherein one or more by-products are formed in the chemical reaction between the precursor and the prepared surface of the substrate.

* * * * *